United States Patent [19]
Chen

[11] Patent Number: 5,960,871
[45] Date of Patent: Oct. 5, 1999

[54] HEAT SINK FOR A COMPUTER

[76] Inventor: Ping-Chieh Chen, No.10-13, Lane 199, San Chun Street, Su Lin Chen, Taipei Hsien, Taiwan

[21] Appl. No.: 09/179,944

[22] Filed: Oct. 28, 1998

[51] Int. Cl.⁶ .................................................. F28F 7/00
[52] U.S. Cl. ...................... 165/185; 165/80.3; 174/16.3; 257/722; 361/703
[58] Field of Search .................................... 165/80.3, 185; 361/697, 703; 257/722; 174/16.3

[56] References Cited

U.S. PATENT DOCUMENTS 5,042,257  8/1991  Kendrick et al. .................... 165/185 X
5,381,859  1/1995  Minakami et al. ..................... 165/80.3

FOREIGN PATENT DOCUMENTS 0032073  3/1979  Japan ....................................... 165/185
0112056  9/1979  Japan ....................................... 165/185

*Primary Examiner*—Ira S. Lazarus
*Assistant Examiner*—Christopher Atkinson
*Attorney, Agent, or Firm*—Dougherty & Troxell

[57] ABSTRACT

A heat sink for a computer includes a base frame having a plurality of upright locating plates, each upright locating plate having pairs of locating flanges of triangular cross section symmetrically raised from two opposite lateral side walls at different elevations, and a Plurality of radiating fins respectively mounted on the upright locating plates at different elevations, the radiating fins each having a longitudinal mounting slot, which receives one upright locating plate of the base frame, and two longitudinal coupling flanges obliequely raised along two opposite lateral sides of the longitudinal mounting slot and stopped between two vertically spaced pairs of locating flanges at one upright locating plate of the base frame.

2 Claims, 6 Drawing Sheets

HEAT SINK FOR A COMPUTER

BACKGROUND AND SUMMARY OF THE INVENTION

The present invention relates to a heat sink for use in a computer for dissipating heat, and more particularly to such a heat sink that can be arranged to increase its air contact surface area without increasing its installation space.

FIG. 1 shows a heat sink for use in a computer for dissipating heat. This structure of heat sink comprises a flat bottom wall and a plurality of radiating fins raised from the flat bottom wall. This structure of heat sink has low performance because of its limited air contact surface area. If to increase the air contact surface area of this structure of heat sink, the size of the heat sink must be relatively increased. If simply increasing the density of the radiating fins at the flat bottom wall of the heat sink, the ventilating efficiency of the heat sink will be affected.

It is one object of the present invention to provide a heat sink that can be arranged to increase its air contact surface area without increasing its installation space. It is another object of the present invention to provide a heat sink that can be adjusted to change its air contact surface area subject to different heat dissipating requirements. To achieve these and other objects of the present invention, there is provided a heat sink comprised of a base frame and a plurality of radiating fins selectively adjustably mounted on the base frame. The base frame has a plurality of upright locating plates, each upright locating plate having apirs of locating flanges of triangular cross section symmetrically raised from two opposite lateral side walls at different elevations. The radiating fins each have a longitudinal mounting slot, which receives one upright locating plate of the base frame, and two longitudinal coupling flanges obliquely raised along two opposite lateral sides of the longitudinal mounting slot and stopped between two vertically spaced pairs of locating flanges at one upright locating plate of the base frame.

DETAILED DESCRIPTION OF THE PREFERRED EMBODIMENT

Figure 1:
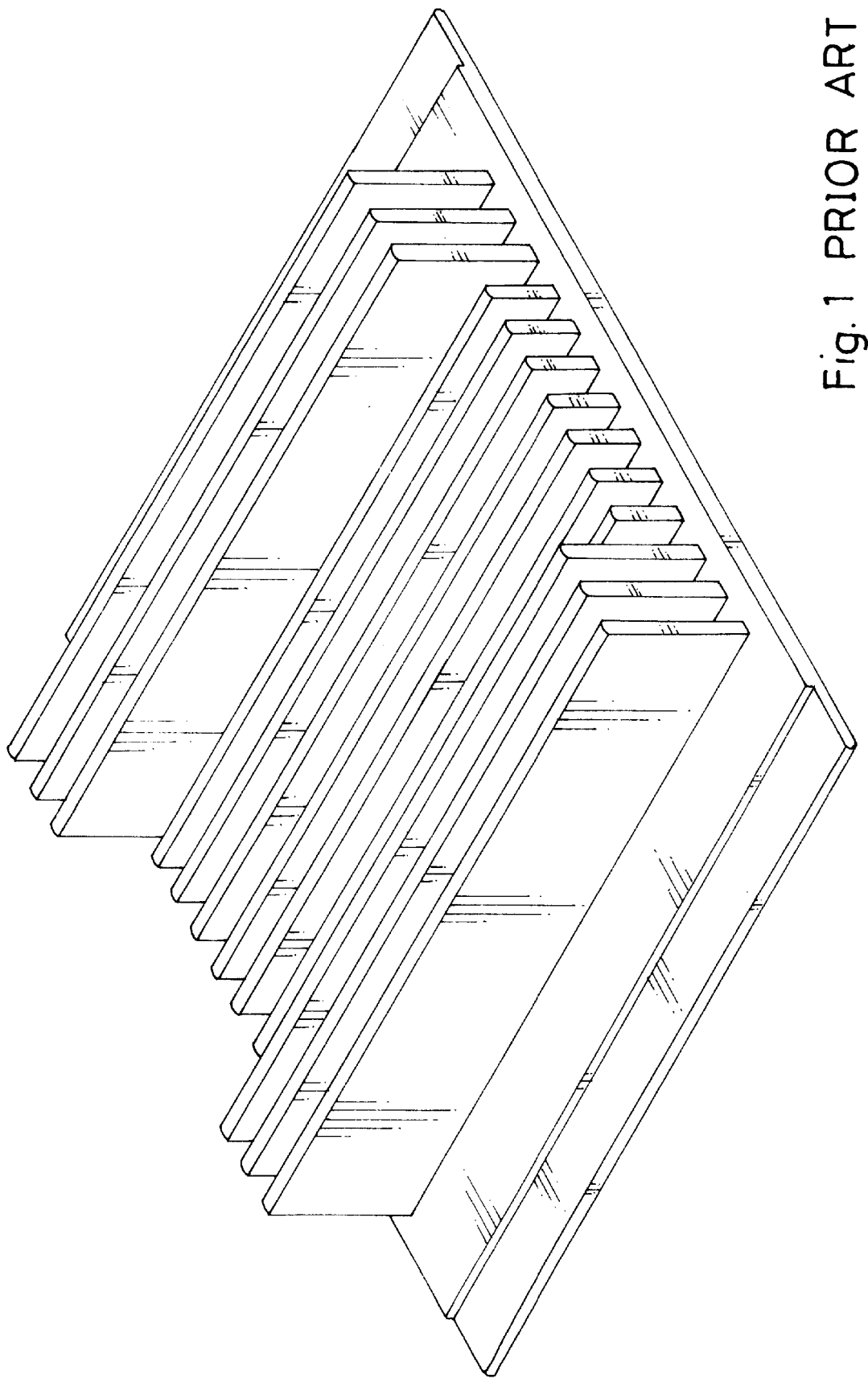
FIG. 1 shows a perspective view of a heat sink according to the prior art.
Figure 2:
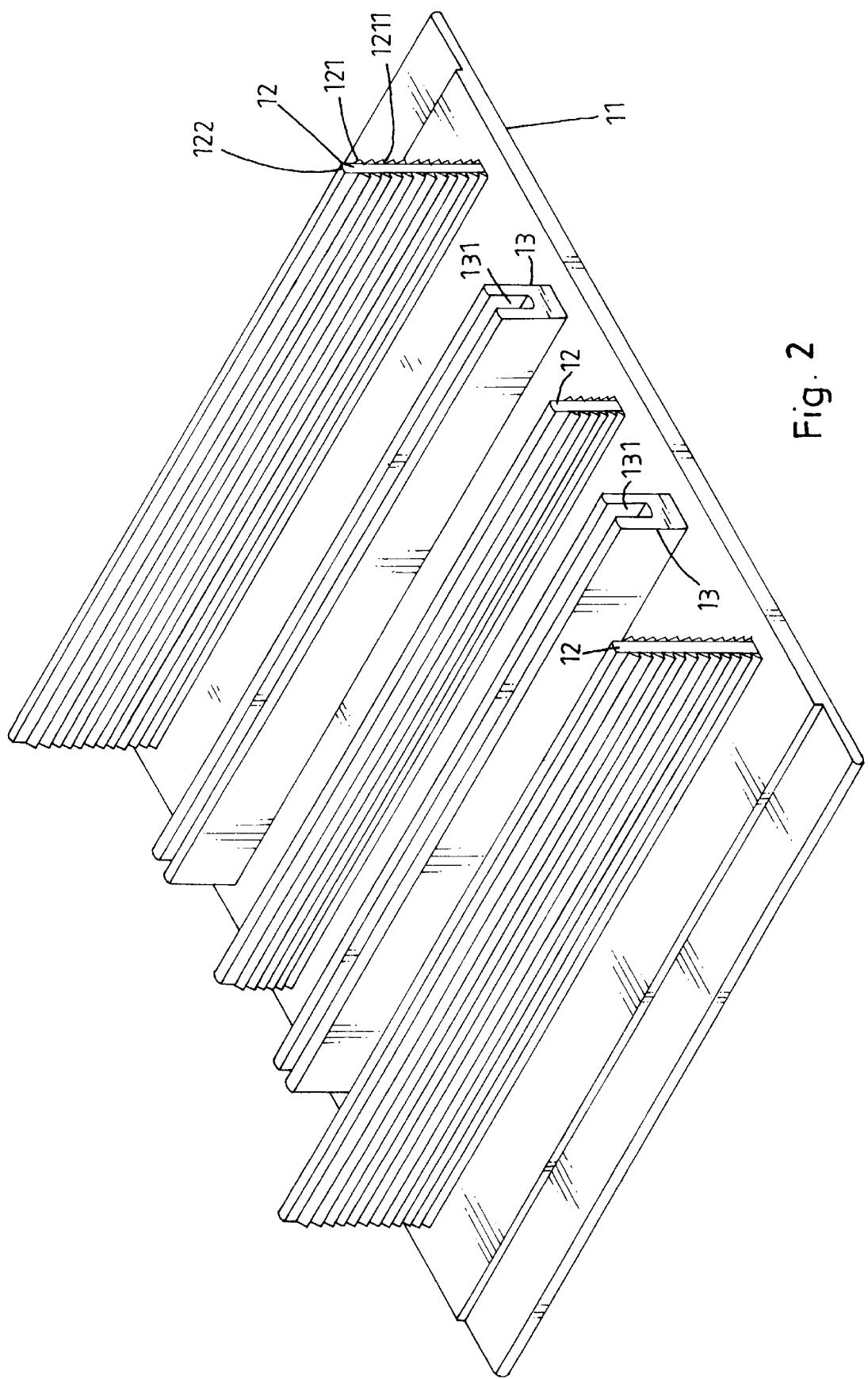
FIG. 2 is a perspective view of a base frame for a heat sink according to the present invention.
Figure 3:
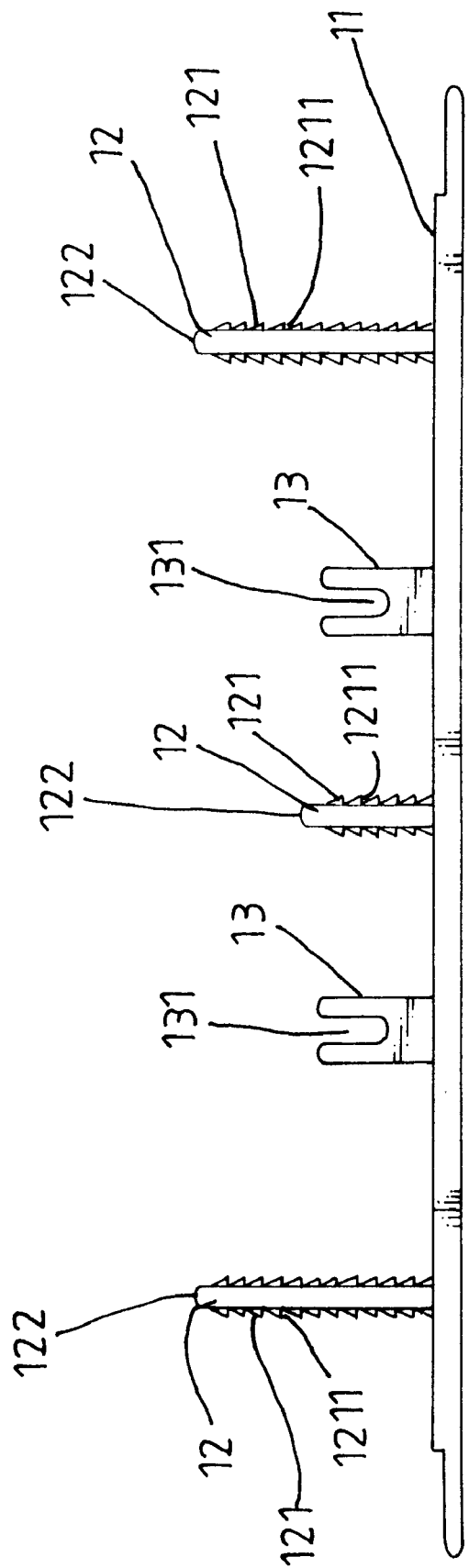
FIG. 3 is a side plain view of the base frame shown in FIG. 2.

Referring to FIGS. 2 and 3, a base frame for a heat sink is shown having a flat bottom plate 11, a plurality of upright locating plates 12 raised from the top side wall of the flat bottom plate 11, two mounting rails 13 raised from the top side wall of the flat bottom plate 11 and separated by the upright locating plates 12. The mounting rails 13 each have a longitudinal mounting groove 131. When a fan (not shown) is mounted on the mounting rails 13, the shell of the fan is fixedly fastened to the longitudinal mounting grooves 131 of the mounting rails 13 by fastening elements.

Figure 5:
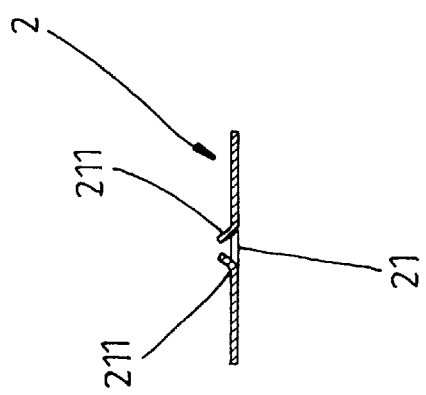
FIG. 5 is an end view of the radiating fin shown in FIG. 4.
Figure 4:
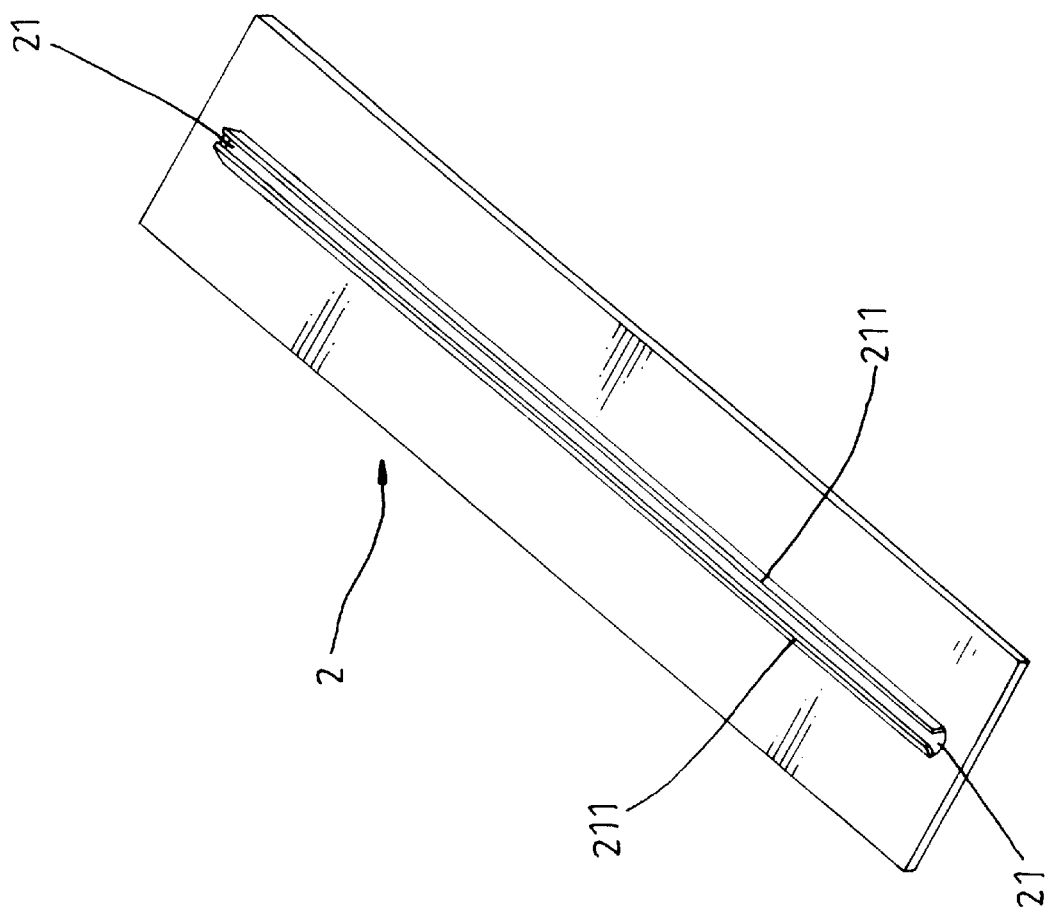
FIG. 4 is a perspective view of a radiating fin according to the present invention.

Referring to FIGS. from 4 through 7 and FIGS. 2 and 3 again, a plurality of radiating fins 2 are respectively mounted on the upright locating plates 12 at different elevations. The upright locating plates 12 each have pairs of locating flanges 121 of substantially triangular cross section symmetrically raised from two opposite lateral side walls at different elevations. Each locating flanges 121 has a flat bottom side wall 1211. The outer side wall of each locating flange 121 slopes outwardly downwards. The radiating fins 2 each have a longitudinal mounting slot 21 and two longitudinal coupling flanges 211 obliquely raised from the top side wall along two opposite lateral sides of the longitudinal mounting slot 21 (see FIGS. 4 and 5). When the longitudinal mounting slot 21 of one radiating fin 2 is coupled to one upright locating plate 12, the longitudinal coupling flanges 211 of the radiating fins 2 are respectively attached to the sloping outer side walls of one lower pair of locating flanges 121 and stopped below the flat bottom side walls 1211 of an upper pair of locating flanges 121. Further, each upright locating plate 12 has a smoothly curved top edge 122 that facilitates the mounting of the radiating fins 2.

Figure 6:
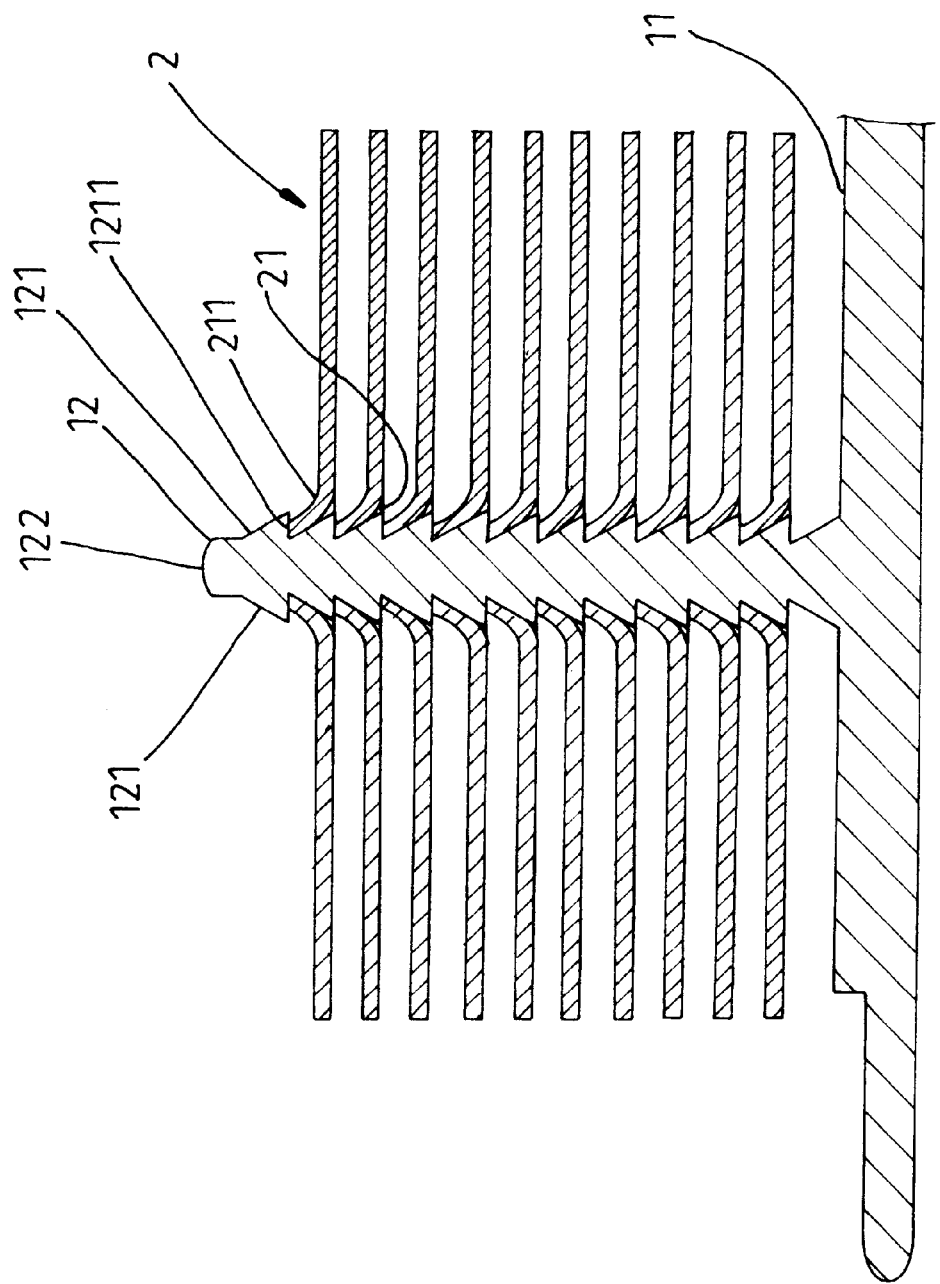
FIG. 6 is a sectional view showing a mounting arrangement of radiating fins at one upright locating plate of the base frame according to the present invention.
Figure 7:
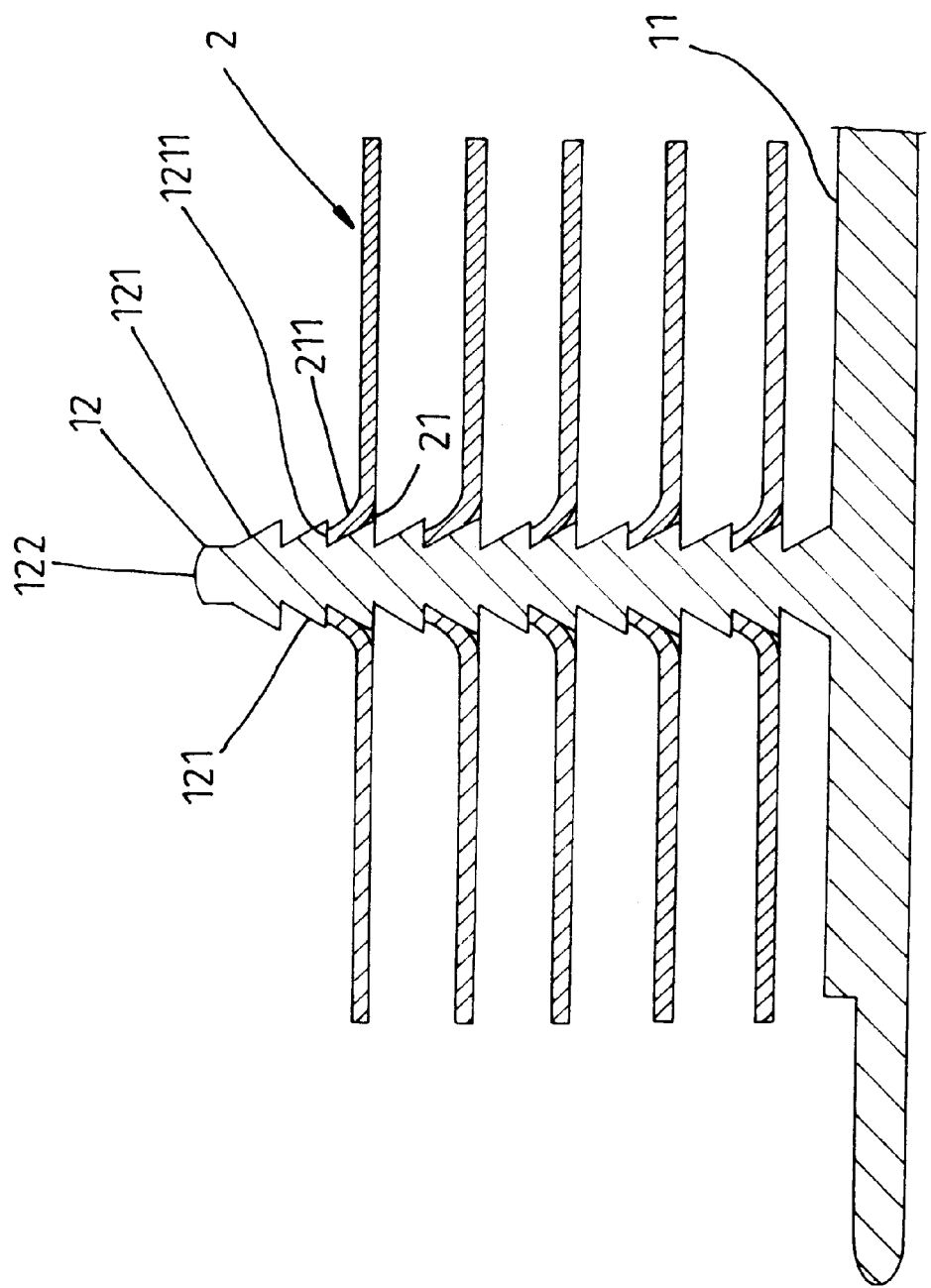
FIG. 7 is a sectional view showing another mounting arrangement of the radiating fins at one upright locating plate of the base frame according to the present invention.

Because a plurality of radiating fins 2 can be mounted on the upright locating plates 12, the air contact surface area of the heat sink can be greatly increased without increasing the installation space of the heat sink. Furthermore, the number of radiating fins 2 at each upright locating plate 12 can be adjusted subject to different heat dissipating requirements (see FIGS. 6 and 7).

I claim:

1. A heat sink for a computer comprising:

a base frame having a flat bottom plate and a plurality of upright locating plates raised from said flat bottom plate and arranged in parallel, said upright locating plates each comprising two opposite lateral side walls and pairs of locating flanges symmetrically raised from the two opposite lateral side walls at different elevations, the locating flanges of said upright locating plates each having a flat bottom side wall and a sloping outer side wall sloping outwardly downwards; and a plurality of radiating fins respectively mounted on said upright locating plates at different elevations, said radiating fins each having a longitudinal mounting slot, which receives one upright locating plate of said base frame, and two longitudinal coupling flanges obliquely raised along two opposite lateral sides of said longitudinal mounting slot and stopped below the flat bottom side walls of one pair of locating flanges at one upright locating plate of said base frame.

2. The heat sink for a computer of claim 1 wherein said upright locating plates of said base frame each have a smoothly curved top edge.

* * * * *